United States Patent
Liu et al.

(10) Patent No.: US 7,868,621 B2
(45) Date of Patent: Jan. 11, 2011

(54) POWER LINE COMMUNICATION BASED AIRCRAFT POWER DISTRIBUTION SYSTEM WITH REAL TIME WIRING INTEGRITY MONITORING CAPABILITY

(75) Inventors: Zhenning Liu, Mississauga (CA); Randy J. Fuller, Hillsburgh (CA); Wenjiang Yu, Mississauga (CA); Yang Ye, Mississauga (CA); Guangjun G. Liu, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 423 days.

(21) Appl. No.: 12/041,941

(22) Filed: Mar. 4, 2008

(65) Prior Publication Data

US 2009/0228223 A1    Sep. 10, 2009

(51) Int. Cl.
*G01R 31/08* (2006.01)
*G01R 31/02* (2006.01)

(52) U.S. Cl. .................... 324/512; 324/534; 702/59; 361/42

(58) Field of Classification Search .......... 324/512, 324/534; 702/59
See application file for complete search history.

(56) References Cited

U.S. PATENT DOCUMENTS

| | | | |
|---|---|---|---|
| 3,842,249 A * | 10/1974 | Geyer et al. | 700/295 |
| 6,421,214 B1 * | 7/2002 | Packard et al. | 361/7 |
| 6,917,888 B2 | 7/2005 | Logvinov et al. | |
| 6,934,655 B2 * | 8/2005 | Jones et al. | 702/108 |
| 6,943,558 B2 * | 9/2005 | Hale et al. | 324/536 |
| 6,992,403 B1 * | 1/2006 | Raad | 307/47 |
| 7,005,995 B2 | 2/2006 | Hornsby et al. | |
| 7,250,772 B2 * | 7/2007 | Furse et al. | 324/534 |
| 2004/0039976 A1 | 2/2004 | Gunther et al. | |
| 2004/0051383 A1 * | 3/2004 | Clark et al. | 307/36 |
| 2004/0156154 A1 * | 8/2004 | Lazarovich et al. | 361/42 |
| 2006/0087382 A1 * | 4/2006 | Cern | 333/24 R |
| 2006/0208661 A1 * | 9/2006 | Mogilner et al. | 315/209 R |

* cited by examiner

*Primary Examiner*—Timothy J Dole
*Assistant Examiner*—John Zhu
(74) *Attorney, Agent, or Firm*—Oral Caglar, Esq.

(57) ABSTRACT

A power line communication-based aircraft power distribution system may allow for both power line communication (PLC) technology and spread spectrum time domain reflectometry (SSTDR) technology to be utilized in aircraft power distribution systems to achieve key maintenance functions. Unlike conventional power distribution systems, which may, for example, use only SSTDR for fault detection, the present invention includes a hardware platform that may allow both the PLC and the SSTDR to be utilized in aircraft power distribution systems to achieve key maintenance functions, such as real time wire fault location, and cost and weight savings. Further, unlike conventional power distribution systems, which may only detect and locate damage in feeder conductor wire sections before the power is applied to the load, the power distribution system of the present invention may permit real time wire fault location.

15 Claims, 6 Drawing Sheets

POWER LINE COMMUNICATION BASED AIRCRAFT POWER DISTRIBUTION SYSTEM WITH REAL TIME WIRING INTEGRITY MONITORING CAPABILITY

BACKGROUND OF THE INVENTION

The present invention generally relates to apparatus and methods for providing power line communication-based aircraft power distribution, and, more specifically, for allowing both power line communication (PLC) technology and spread spectrum time domain reflectometry (SSTDR) technology to be utilized in aircraft power distribution systems to achieve key maintenance functions.

The issue of aircraft wiring safety has received widespread attention in recent years, highlighted by the unfortunate TWA 800 and Swissair 111 tragedies. Meanwhile, there has been an increasing reliance on electrical power on modern and future public transport aircraft for flight control, engine and flight management systems. Along with this increasing reliance comes an associated increase in the use of computers, in addition to passenger services and entertainment systems, making such aircraft more vulnerable to electrical fires caused by arcing from wiring problems.

Various technologies in detecting and pinpointing the wiring problems have been proposed and developed to address safety concerns, among which, Spread Spectrum Time Domain Reflectometry (SSTDR) has received particular attention and has demonstrated its potential as an effective way of locating intermittent faults on aircraft wires during flight.

For example, U.S. Pat. No. 7,005,995, issued to Hornsby et al., discloses a method of using an SSPC to remotely detect and locate damage in feeder conductor wire sections before the power is applied to the load. Hornsby et al., however, neither disclose continuous real-time wire fault location detection, nor make use of the PLC as part of their system.

In an advanced aircraft power distribution system, each section of the power bus and the feeder wire for every electric load is protected from the thermal (over current) stress by either a smart contactor or a remote power controller (RPC). These devices are all equipped with certain level of intelligence to perform required functions, such as bus switching and load controls, bus and feeder wire over current protections, arc fault detection (AFD), and the like.

A typical way of controlling the smart contactors and RPCs is through the aircraft data bus from designated integrated modular avionics (IMA) to gateways, which then pass the command to each smart contactor and RPC through internal data buses. Such centralized control of the power distribution usually requires additional hardware to facilitate the control, and puts high constraints on the hardware reliability, and therefore drives the cost and weight.

Power line communication (PLC) technology could result in wiring and cost savings, as well as relaxed system requirements. However, due to the size and number of signal coupling circuitry (the tap circuitry) for both transmitting and receiving data over the power bus, and the fast growing competing wireless communication technologies, the idea of using PLC has been seriously challenged.

As can be seen, there is a need for a PLC-based power system and methods having real time wiring integrity monitoring capability.

SUMMARY OF THE INVENTION

In one aspect of the present invention, a power distribution system comprises an electric power control unit communicating with a main data bus; and at least two power line communication (PLC) tap points, each of the at least two PLC tap points communicating with the electric power control unit, wherein a signal sent between the at least two PLC tap points in the power distribution system is used to determine a wire integrity between the at least two PLC tap points.

In another aspect of the present invention, a power distribution system comprises an electric power control unit communicating with a main data bus; at least two power line communication (PLC) tap points, each of the at least two PLC tap points communicating with the electric power control unit; and signal processing circuitry for sending a spread spectrum time domain reflectometry (SSTDR) signal into the power distribution system via the PLC tap points, wherein a signal sent between the at least two PLC tap points in the power distribution system is used to determine a wire integrity between the at least two PLC tap points, and wherein the SSTDR signal is used to locate a fault location in the power distribution system.

In a further aspect of the present invention, a method for performing real time wiring integrity monitoring of a power distribution system comprises sending data from an electric power control unit to the power distribution system through at least two power line communication (PLC) tap points; and analyzing the data for errors to indicate wire integrity of the power distribution system between the at least two PLC tap points.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides apparatus and methods for providing power line communication-based aircraft power distribution, and, more specifically, for allowing both power line communication (PLC) technology and spread spectrum time domain reflectometry (SSTDR) technology to be utilized in aircraft power distribution systems to achieve key maintenance functions. The present invention may be used in, for example, commercial aircraft, military aircraft, ground-based vehicles and the like.

The present invention includes a hardware platform that may allow both the PLC and the SSTDR to be utilized in the aircraft power distribution system to achieve key maintenance functions, such as real time wire fault location, and cost and weight savings. PLC substation modules may be introduced into the electric power control unit (EPCU) to facilitate the more efficient PLC based communication within the electric power distribution system, better EPCU performance under various bus configurations, more system functions, and wire savings. The PLC based power distribution system architecture of the present invention particularly suits the use of stand-alone (remote power controllers) RPCs with PLC interface, which may allow a rack type solution for housing the stand-alone RPC units for cost reduction and better thermal arrangement; independent channel control from other channels; RPC allocation flexibility based on location convenience (individually, or in groups), for wire savings; and elimination of control and signal wires. The present invention also includes methods of performing real time wiring integrity monitoring.

Recent developments and progress in the SSTDR technology, a significant aircraft wiring maintenance enabler, may offer a unique and viable way of locating the intermittent wiring fault on wires that are live during flight before the power being removed by arc fault detection (AFD) trips. Since the SSTDR technology is based on the same principle as that of the PLC using spread spectrum modulated signals in transmitting and receiving information over a live power line, the same set of signal coupling circuitry can be used to serve both purposes.

Unlike conventional power distribution systems, which may, for example, use only SSTDR for fault detection, the present invention includes a hardware platform that may allow both the PLC and the SSTDR to be utilized in aircraft power distribution systems to achieve key maintenance functions, such as real time wire fault location, and cost and weight savings. Further unlike conventional power distribution systems, which may detect and locate damage in feeder conductor wire sections only before the power is applied to the load, the power distribution system of the present invention may permit real time wire fault location.

Figure 1:
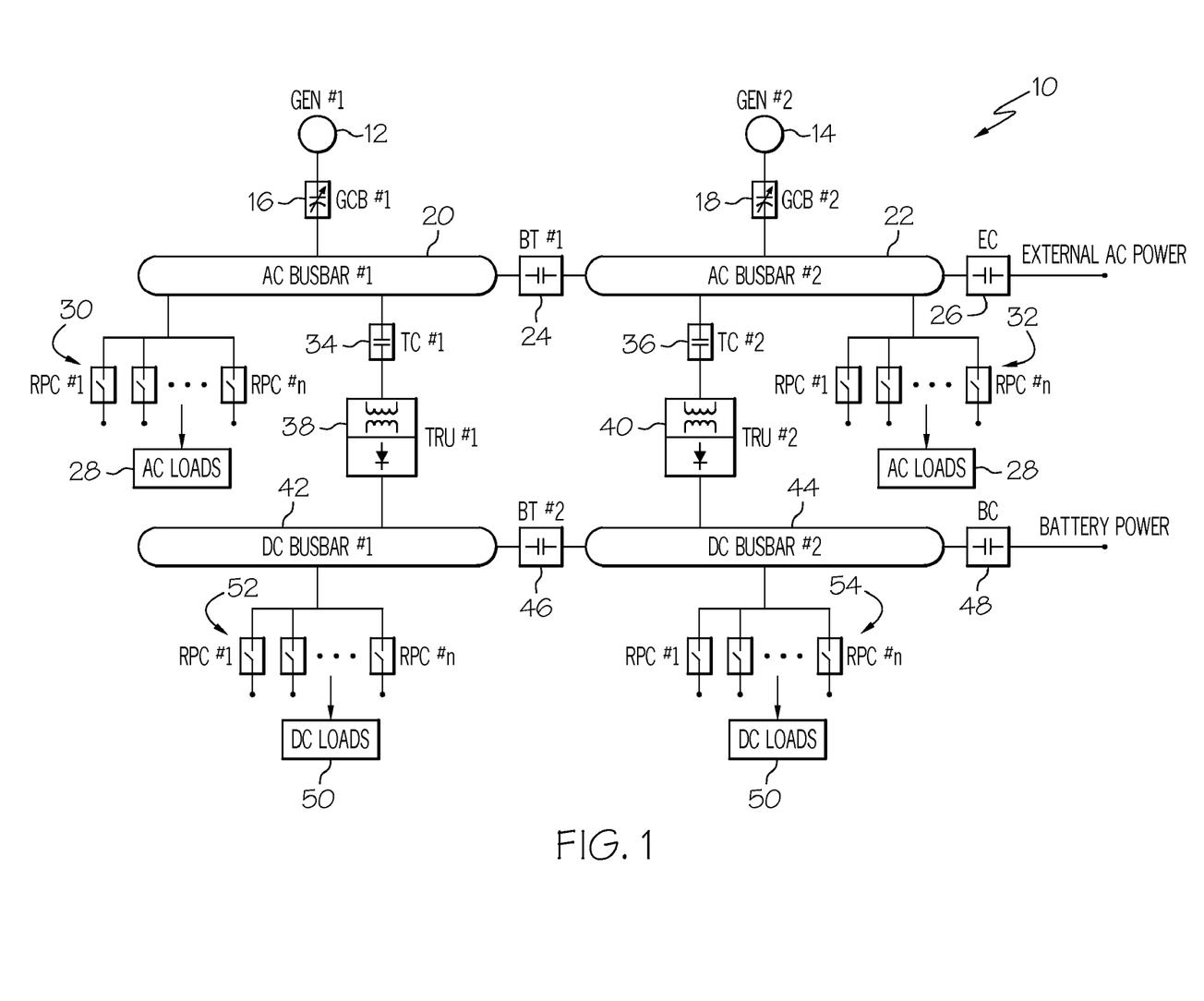
FIG. 1 is a schematic drawing of the power line elements of an aircraft power distribution system usable in the apparatus and methods of the present invention.

Referring to FIG. 1, there is shown a schematic drawing of the power line elements of an aircraft power distribution system 10 usable in the apparatus and methods of the present invention. At least one power source, such as a first generator 12 and a second generator 14 may be connected through generator contactors 16, 18, respectively. The generators 12, 14 may provide alternating current (AC) to first and second AC bus bars 20, 22, which may be electrically connected through an AC bus bar contactor 24. AC bus bar 22 may be connected to external AC power (not shown) through an external contactor 26. Each AC bus bar 20, 22 may supply power to a plurality of AC loads 28 through a series of switches, such as AC RPCs 30, 32.

The AC bus bars 20, 22 may be connected via transformer contactors 34, 36 to transformer rectifier units 38, 40, respectively. The transformer rectifier units 38, 40 may provide direct current (DC) to first and second DC bus bars 42, 44. Similar to the AC bus bars 20, 22, the DC bus bars 42, 44 may be electrically connected through a DC bus bar contactor 46. DC bus bar 44 may be connected to battery power (not shown) through a battery contactor 48. Each DC bus bar 42, 44 may supply power to a plurality of DC loads 50 through a series of DC RPCs 52, 54.

In this system 10, electric power may be distributed from the generators 12, 14 to the aircraft loads 28, 50 through the AC or DC bus bars 20, 22, 42, 44 and the AC or DC RPCs 30, 32, 52, 54. These RPCs 30, 32, 52, 54 can take advantage of the PLC to achieve wire savings and real time wire integrity monitoring, as discussed in greater detail below. The RPCs 30, 32, 52, 54 may be used to interrupt power to the loads 28, 50 when, for example, wire integrity issues may be detected, as discussed in further detail below.

Figure 2:
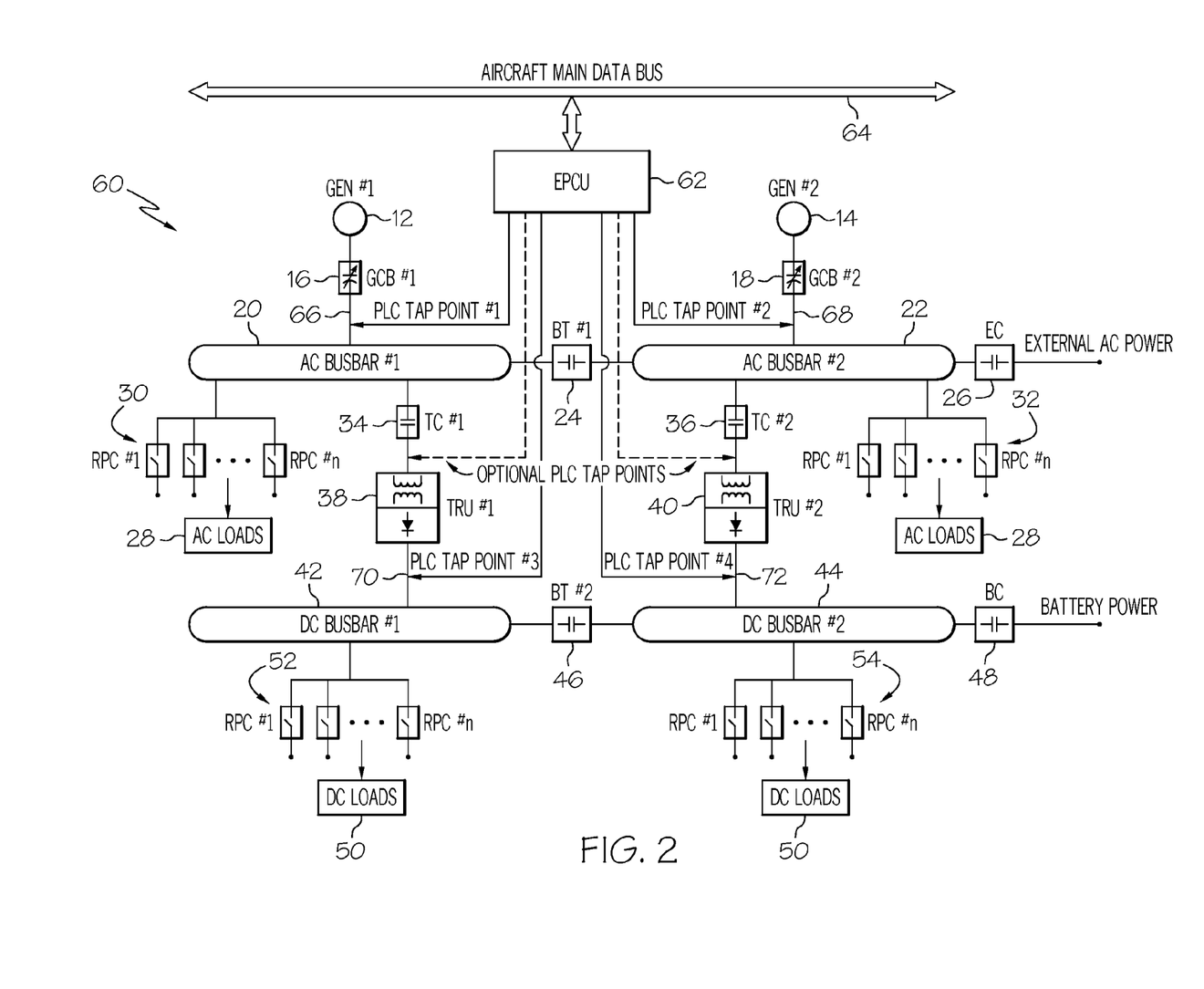
FIG. 2 is a schematic drawing showing a PLC strategy according to the present invention incorporated into the aircraft power distribution system of FIG. 1.

Referring to FIG. 2, there is shown a schematic drawing of a PLC strategy 60 according to the present invention incorporated into the aircraft power distribution system 10 of FIG. 1. In FIG. 2 (as well in FIG. 3, described below), elements previously described with reference to FIG. 1, shown with like reference designations in FIG. 2, have similar structure and function as previously described.

In order to facilitate the PLC over power line networks of an aircraft, four PLC substation modules 74 (see FIG. 3) may be introduced into an electric power control unit (EPCU) 62. The EPCU 62 may communicate with an aircraft main data bus 64. The EPCU 62 may perform the following functions: electrical power bus control (or reconfiguration), electrical load management, load commutation, system diagnostics and built-in test equipment (BITE) reporting, maintenance functions and data loading. The majority of these functions were traditionally performed by the integrated modular avionics (IMA), but now may be allocated in the EPCU 62 for decentralized electric power system control and improved system performance.

Each of the PLC substation modules 74 (see FIG. 3) may be connected to a particular point at a power bus bar. Each of these particular points may be designated as PLC tap points. For example, one of the PLC substation modules 74 may be connected to a first PLC tap point 66 located between the generator contactor 16 and the AC bus bar 20 (see FIG. 2). A second PLC tap point 68 may be located between the generator contactor 18 and the AC bus bar 22. A third PLC tap point 70 may be located between the transformer rectifier unit 38 and the DC bus bar 42. A fourth PLC tap point 72 may be located between the transformer rectifier unit 40 and the DC bus bar 44. Additional optional PLC tap points may also be present, including, for example, those shown with dashed lines in FIG. 2.

Figure 3:
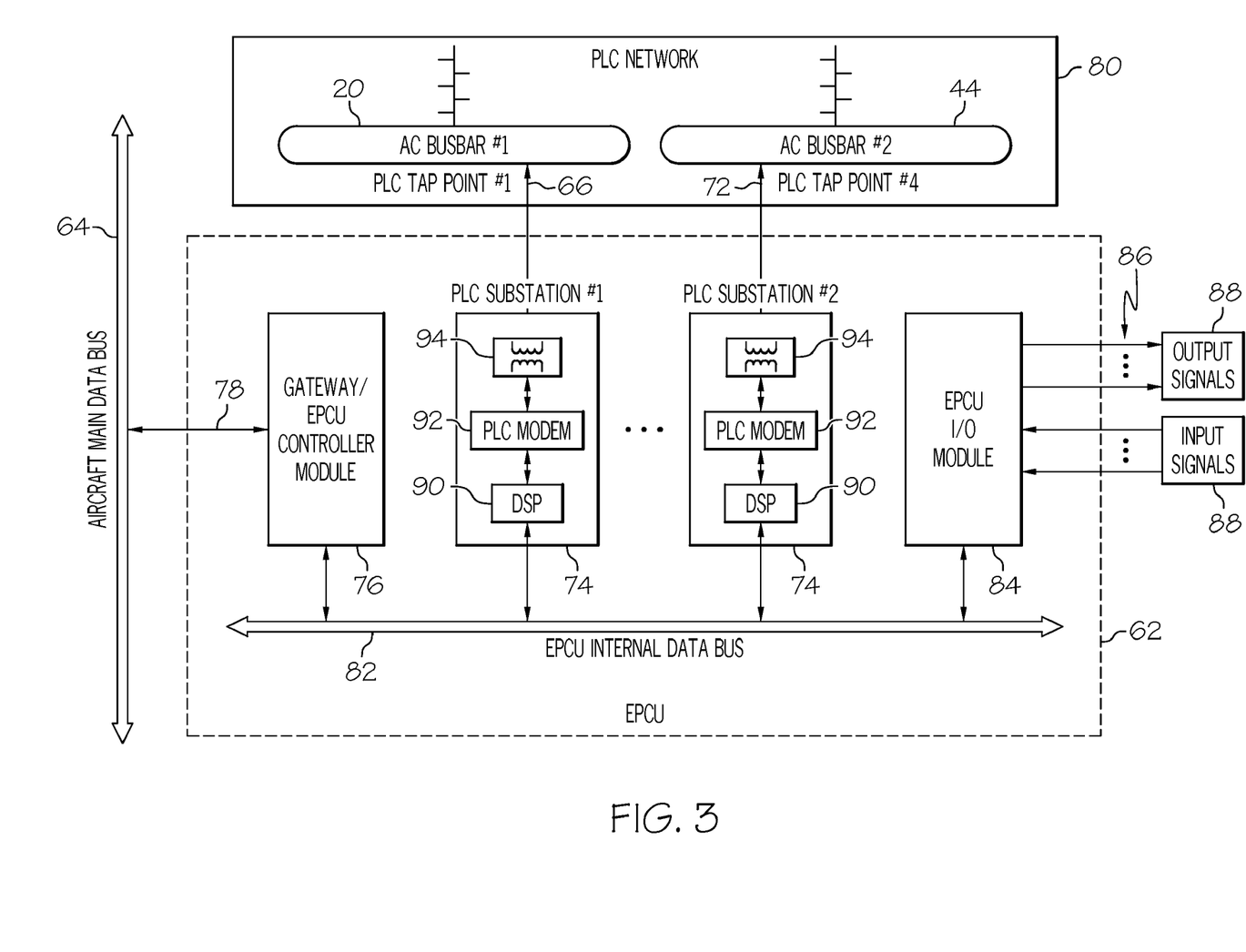
FIG. 3 is a schematic drawing showing one example of an electric power control unit (EPCU) according to the present invention.

Referring now to FIG. 3, there is shown a schematic drawing of one example of the EPCU 62 according to the present invention. The introduction of PLC substation modules 74 into the EPCU 62 may facilitate the more efficient PLC based communication within the electric power distribution system 10 (see FIG. 1), further better fulfills the EPCU 62 functions, and may result in wire savings.

A gateway/EPCU controller module 76 may be responsible for performing all the EPCU functions mentioned above and providing an interface 78 between the PLC network 80 and the aircraft main data bus (e.g. avionics full-duplex switched ethernet (AFDX), common data network (CDN) and the like) 64, through the PLC substation modules 74 and an EPCU internal data bus 82.

An EPCU I/O module 84 may be responsible for providing an interface 86 between the gateway/EPCU controller module 76 and the input and output signals 88 necessary to facilitate the EPCU functions, through the EPCU internal data bus 82. These input and output signals 88 may include, for example, normal aircraft control and monitoring functions, such as the status of electrical controls and the like.

The PLC substation module 74 may play both a role of gateway for the connecting PLC network 80, and a role of master node in the PLC network 80 to provide the communication control. Each PLC substation 74 may comprise a digital signal processor (DSP) 90 which may interface to at least one PLC modem 92 and power line coupler circuitry 94. Each power line coupler circuitry 94 may be connected to a particular point (e.g., tap point 66, 68, 70, 72) at a power bus bar (e.g., AC bus bar 20, 22 or DC bus bar 42, 44) as the control access to the associated power line network. The power line coupler circuitry 94 may include an isolated transformer (not shown). Additional (optional) tap points (with PLC modem 92 and power line coupler circuitry 94) can be added to the network to provide capabilities for the EPCU 62 to maintain bus control in particular bus configurations, and verify the wire (or bus) integrity of particular sections, as shown with dash lines in FIG. 2.

Figure 4:
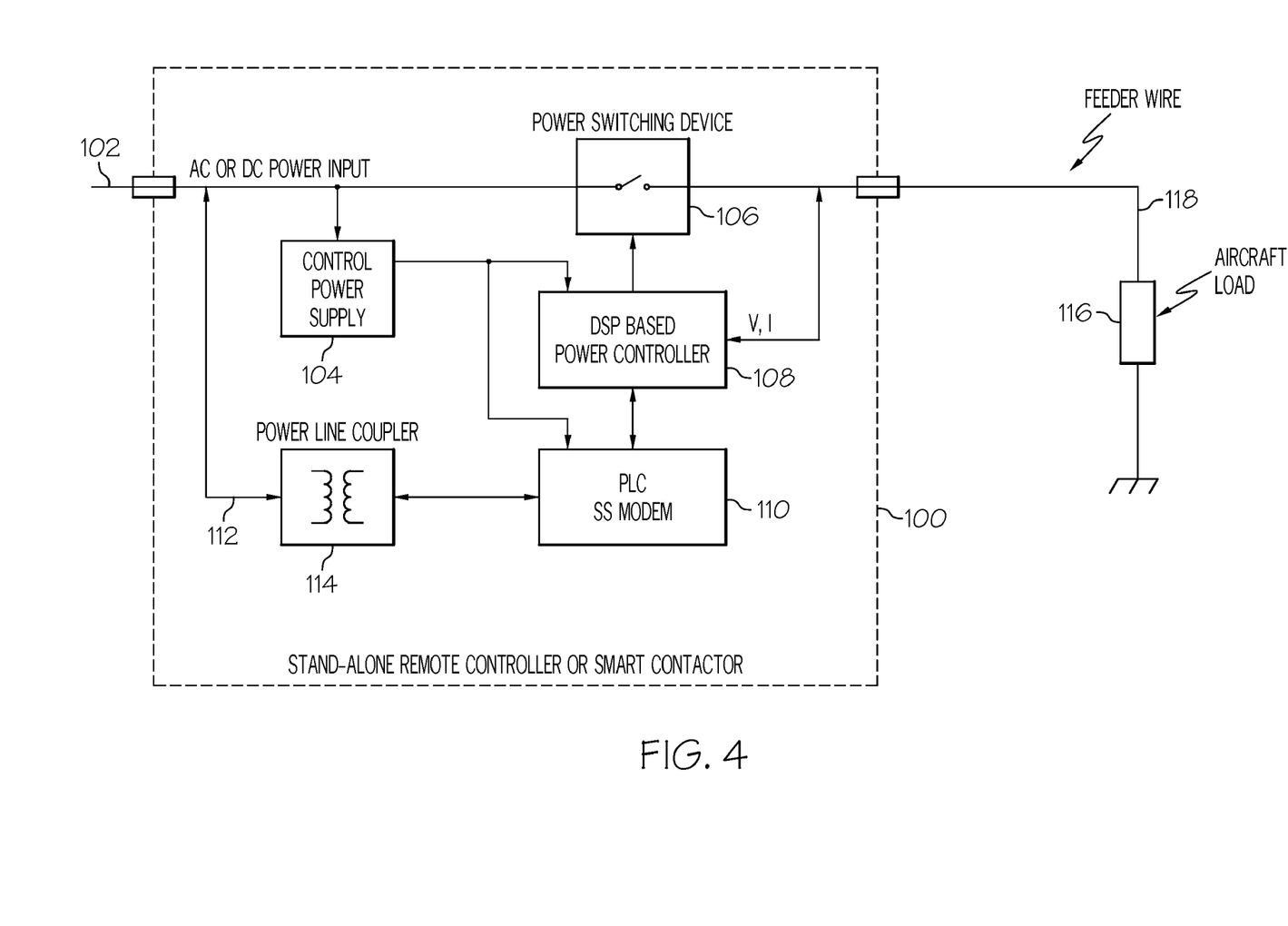
FIG. 4 is a schematic drawing showing one example of a stand-alone remote power controller (RPC) or smart contactor having PLC capability according to the present invention.

Referring to FIG. 4, there is shown a schematic drawing of one example of a stand-alone remote power controller (RPC) 100 or smart contactor having PLC capability according to the present invention. The RPC 100 may be an electromagnetic relay/contactor or a solid state power controller. The RPC 100 may include a power input 102 to provide power to a central power supply 104 and a power switching device 106. The central power supply 104 may provide power to a DSP based power controller 108 and a PLC secured series (SS) modem 110. The modem 110 may provide a power line signal 112, via a power line coupler 114, to the power input 102. The power switching device 106 may connect the power input 102 to an aircraft load 116 via a feeder wire 118.

The DSP based power controller 108 inside the RPC 100 may be used to perform the following functions: receiving command and status report through PLC network; channel load on/off control; feeder wire protection from over current and arc fault; load configuration control, periodic built-in-test (BIT), and other housekeeping tasks; operating software and configuration data loadings, software testing and debugging; and real time feeder wire integrity monitoring using SSTDR via the same PLC interface.

As discussed above, this last function (real time feeder wire integrity monitoring using SSTDR via the same PLC interface) that may justify the use of PLC based power distribution architecture, which allows real time health monitoring of the wiring systems. This architecture may also particularly suit the use of stand-alone RPCs (e.g., RPC 100) with PLC interface, which may allow a rack type solution for housing the stand-alone RPC units for cost reduction and better thermal arrangement; independent channel control from other channels; RPC allocation flexibility based on location convenience (individually, or in groups), for wire savings; and elimination of control and signal wires.

Real time wire integrity monitoring can be realized in an aircraft power distribution system (e.g., system 10) with above described architecture in two ways:

(I) Direct Wire Integrity Check Through PLC

Since communications between the EPCU 62 and each individual RPC 100 are all via the power line network 80 itself, the integrity of the wire (or bus bar) sections between any two PLC nodes (including the two tap points connecting to the same PLC substation module), can be verified through routine, or designated data exchange. For example, if communications over a particular section of power line network 80 frequently encounter errors, while a nearby section in a similar environment does not, this could indicate the potential intermittent wire integrity problem.

This method, however, may not provide fault location, and may cover only the power lines or wires in between the PLC nodes (e.g., PLC tap points 66, 68, 70, 72). The feeder wires (e.g., feeder wire 118) from the RPCs 100 to various aircraft loads 116, which may constitute a more significant portion of the aircraft wirings, cannot be checked using this method, unless there is a PLC node located at the load end.

(II) Real Time Wiring Fault Location Using SSTDR Through PLC Interface

SSTDR is a known method that may send a high frequency signal, such as a sine-wave-modulated pseudorandom number (PN) code, down the line, which reflects back at impedance discontinuities such as open or short circuits. The difference (time delay or phase shift) between the incident and reflected signal is used to locate the fault on the wire.

Figure 5:
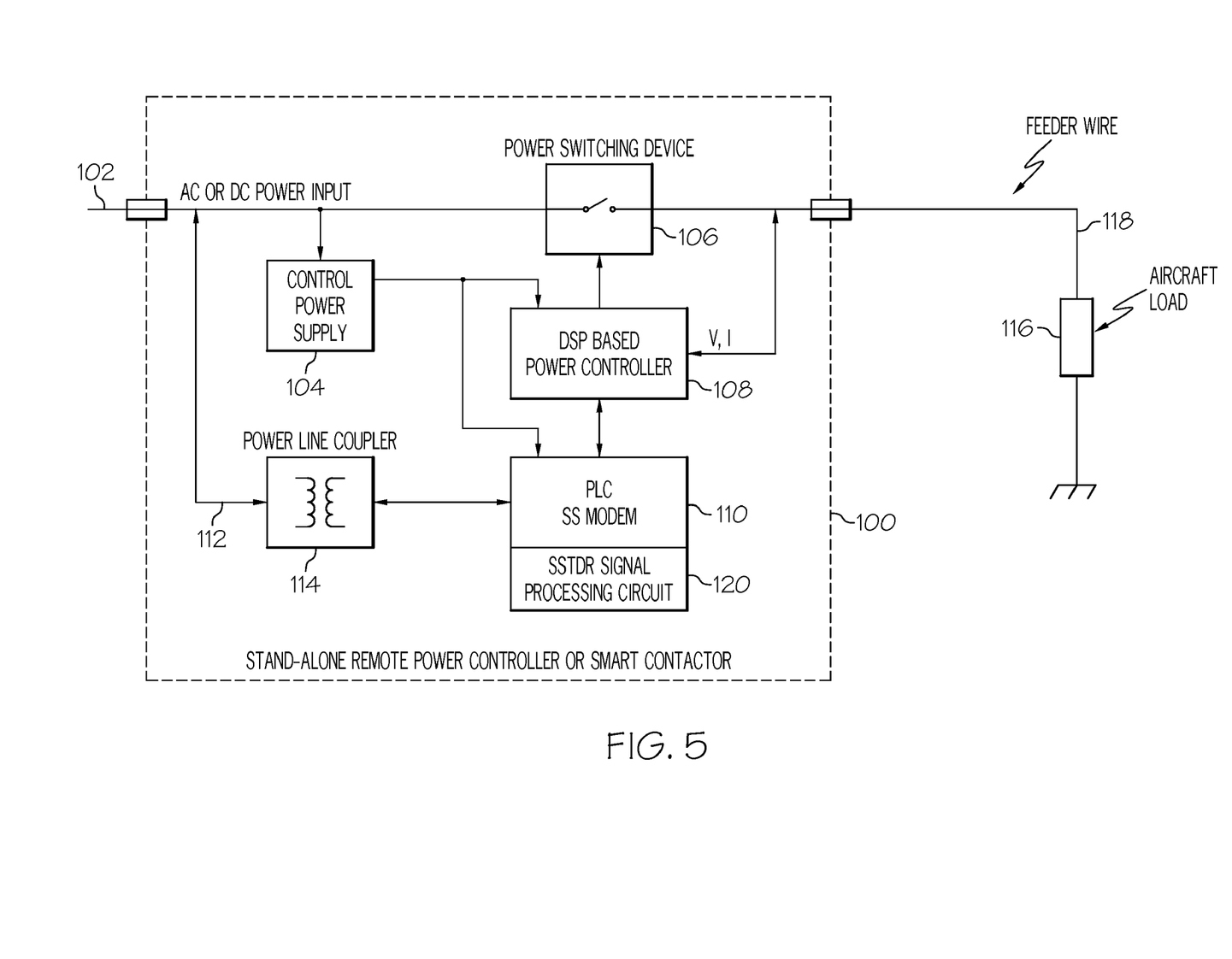
FIG. 5 is a schematic drawing showing one example of the stand-alone remote power controller (RPC) of FIG. 4 including an SSTDR signal processing circuit according to the present invention.

Since the data transmitted on the PLC network 80 is already a spread spectrum signal and each PLC node, whether it is a PLC substation 74, or an RPC 100, is equipped with a DSP (e.g., DSP 90) and the capability of sending and receiving the spread spectrum modulated signals through the PLC interface circuitry, only an additional SSTDR signal processing circuitry 120 needs to be included into the existing PLC based RPC 100 to implement the real time wiring fault location function, as shown in FIG. 5.

Figure 6:
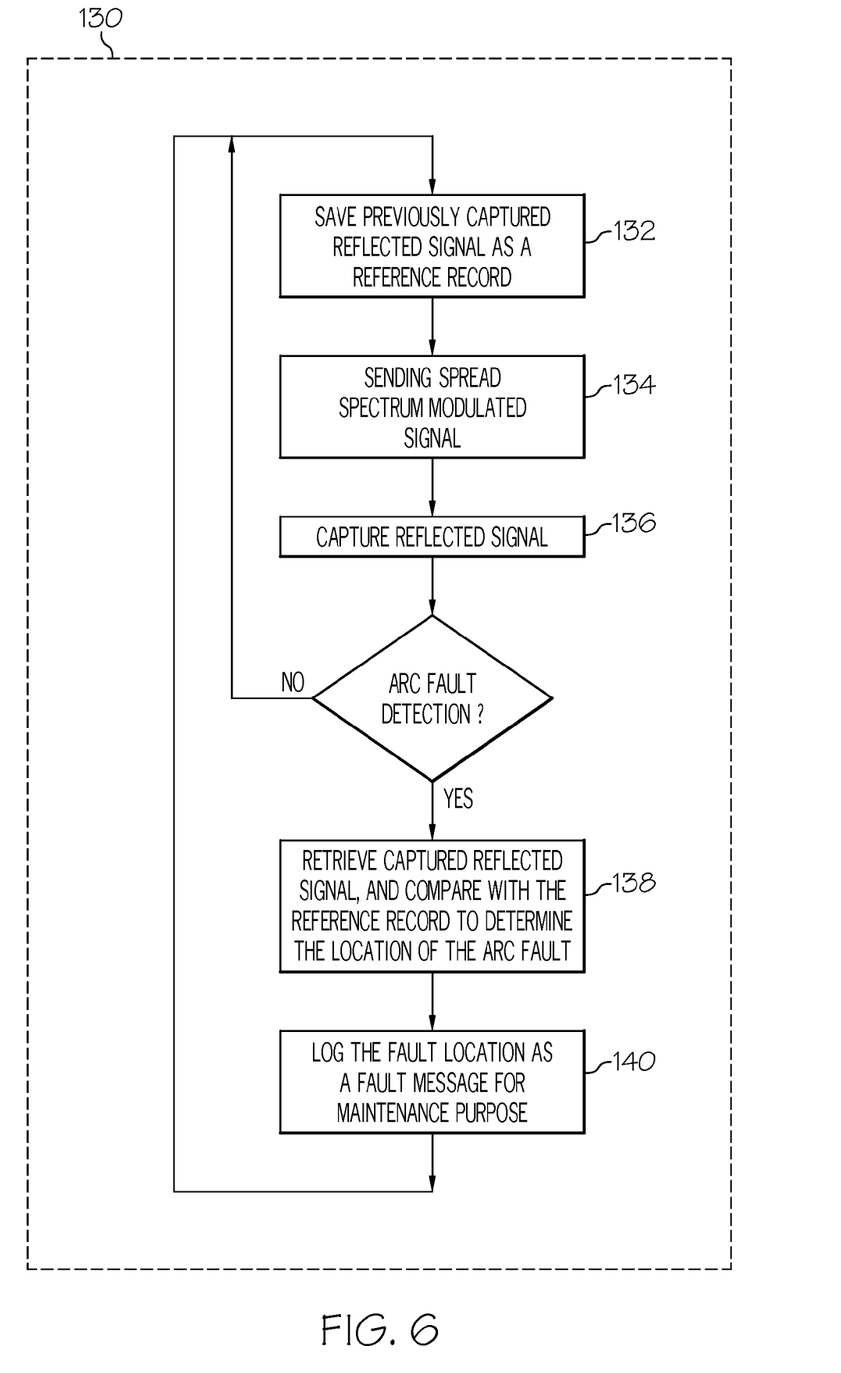
FIG. 6 is a flow chart describing a method of performing real time wiring integrity monitoring according to the present invention.

Referring now to FIG. 6, there is shown a flow chart describing a method 130 of performing real time wiring integrity monitoring according to the present invention. The method 130 may include a step 132 of saving previously captured reflected signal as a reference record in either an electric power control unit (e.g., EPCU 62), or a RPC unit (e.g., RPC 100). A step 134 may then send a new spread spectrum modulated signal (or data) either from an electric power control unit (e.g., EPCU 62) to the power distribution system (e.g., power distribution system 10) through at least two power line communication (PLC) tap points (e.g., PLC tap points 66, 68, 70, 72), or from a RPC unit (e.g., RPC 100) to its feeder wire (e.g., Feeder wire 118). A step 136 may then capture the reflected signal and save it in the in-system memory. If an arc fault is detected by the embedded arc fault detection algorithm at this moment, a step 138 may retrieve the captured reflected signal in step 136, and compare it with the reference record saved in step 132 and determine the location of the arc fault based on the arc fault location methodology using SSTDR. A step 140 may then log the arc fault location as a fault message for maintenance purpose. If there is no arc fault detection after step 136, the process will be repeated starting from step 132. In one embodiment of the present invention, the steps 132, 134, 136, 138 and 140 may be carried out in real time, during operation of the power distribution system.

It should be understood, of course, that the foregoing relates to exemplary embodiments of the invention and that modifications may be made without departing from the spirit and scope of the invention as set forth in the following claims.

We claim:

1. A power distribution system comprising:
at least one generator;
at least one AC bus bar receiving power from the generator;
at least one switch electrically connecting the AC bus bar to an AC load;

an electric power control unit communicating with a main data bus; and at least two power line communication (PLC) tap points, each of the at least two PLC tap points communicating with the electric power control unit;

wherein a signal sent between the at least two PLC tap points in the power distribution system is used to determine a wire integrity between the at least two PLC tap points;

wherein the switch comprises:
  a control power supply;
  a digital signal processor-based power controller and a PLC modem receiving power from the control power supply;
  a power line coupler for delivering a power line signal from the PLC modem to a power input of the switch; and
  signal processing circuitry for sending a spread spectrum time domain reflectometry (SSTDR) signal into the power distribution system;
wherein the switch interrupts power being sent over a portion of the power distribution system when the electric power control unit determines the wire integrity as being faulty.

2. The power distribution system according to claim 1, wherein the at least one switch is a remote power controller.

3. The power distribution system according to claim 1, wherein the electric power control unit includes at least one PLC substation.

4. The power distribution system according to claim 3, wherein each PLC substation includes a digital signal processor communicating with an internal data bus, a PLC modem communicating with the digital signal processor, and power line coupler circuitry for sending the signal to at least one of the two PLC tap points.

5. The power distribution system according to claim 4, wherein the power line coupler circuitry includes an isolation transformer.

6. The power distribution system according to claim 4, further comprising a gateway/EPCU controller module for providing an interface between the power distribution system and the main data bus via each PLC substation.

7. The power distribution system according to claim 6, further comprising an EPCU I/O module for providing an interface between the gateway/EPCU controller module and input and output signals via the internal data bus.

8. The power distribution system according to claim 1, wherein the SSTDR signal is sent into the power distribution system over an interface used for the signal sent between the at least two PLC tap points.

9. The power distribution system according to claim 1, further comprising at least one DC bus bar.

10. The power distribution system according to claim 9, further comprising
  a plurality of the AC bus bars;
  a plurality of the DC bus bars; and
  at least one PLC tap point for each of the AC bus bars and for each of the DC bus bars.

11. A power distribution system comprising:
  an electric power control unit communicating with a main data bus;
  at least two power line communication (PLC) tap points, each of the at least two PLC tap points communicating with the electric power control unit; and
  signal processing circuitry for sending a spread spectrum time domain reflectometry (SSTDR) signal into the power distribution system via the PLC tap points,
  a PLC substation module incorporated into the electric power control unit to facilitate PLC based communication within the electric power distribution system,
  wherein a signal, from the PLC substation, sent between the at least two PLC tap points in the power distribution system is used to determine a wire integrity between the at least two PLC tap points, and
  wherein the SSTDR signal is used to locate a fault location in the power distribution system.

12. The power distribution system according to claim 11, further comprising:
  at least a first generator and a second generator;
  at least one AC bus bar receiving power from one of the first generator and the second generator; and
  at least one switch electrically connecting the AC bus bar to an AC load,
  wherein the switch interrupts power being sent over a portion of the power distribution system when the wire integrity is determined to be faulty.

13. The power distribution system according to claim 12, wherein the switch is a remote power controller which comprises:
  a control power supply;
  a digital signal processor-based power controller and a PLC modem receiving power from the control power supply; and
  a power line coupler for delivering a power line signal from the PLC modem and the SSTDR signal to a power input of the switch.

14. The power distribution system according to claim 11, wherein the signal, from the PLC substation, and the SSTDR signal are sent over the power distribution system during operation thereof.

15. A method for performing real time wiring integrity monitoring of a power distribution system, the method comprising:
  sending data from an electric power control unit to the power distribution system through at least two power line communication (PLC) tap points;
  analyzing the data for errors to indicate wire integrity of the power distribution system between the at least two PLC tap points;
  sending spread spectrum modulated signals through the PLC tap points;
  analyzing the spread spectrum modulated signals to determine a location of impedance discontinuities in the power distribution system;
  saving a previously captured reflected signal as a reference record;
  capturing the reflected signal of the spread spectrum modulated signals sent through the PLC tap points; and
  retrieving captured reflected signal and comparing the captured reflected signal with the reference record to determine a location of an arc fault.

* * * * *